(12) United States Patent
Buschbeck et al.

(10) Patent No.: US 8,869,967 B2
(45) Date of Patent: Oct. 28, 2014

(54) DYNAMIC LOAD LOCK WITH CELLULAR STRUCTURE FOR DISCRETE SUBSTRATES

(71) Applicant: Applied Materials, Inc., Santa Clara, CA (US)

(72) Inventors: Wolfgang Buschbeck, Hanau (DE); Juergen Henrich, Limeshain (DE); Andreas Lopp, Freigericht-Somborn (DE); Susanne Schlaefer, Kleinostheim (DE)

(73) Assignee: Applied Materials, Inc., Santa Clara, CA (US)

( * ) Notice: Subject to any disclaimer, the term of this patent is extended or adjusted under 35 U.S.C. 154(b) by 109 days.

(21) Appl. No.: 13/748,271

(22) Filed: Jan. 23, 2013

(65) Prior Publication Data
US 2013/0199891 A1 Aug. 8, 2013

Related U.S. Application Data

(60) Provisional application No. 61/596,654, filed on Feb. 8, 2012, provisional application No. 61/612,080, filed on Mar. 16, 2012.

(51) Int. Cl.
*B23B 13/00* (2006.01)
*H01L 21/67* (2006.01)
*H01L 21/677* (2006.01)

(52) U.S. Cl.
CPC .... *H01L 21/67739* (2013.01); *H01L 21/67201* (2013.01)
USPC ...................... 198/339.1; 414/217; 414/217.1

(58) Field of Classification Search
USPC ...................... 198/339.1, 346.2, 346.3, 688.1; 414/217, 217.1, 221, 805
See application file for complete search history.

(56) References Cited

U.S. PATENT DOCUMENTS

| | | | | |
|---|---|---|---|---|
| 7,959,403 B2* | 6/2011 | van der Meulen | ............ | 414/805 |
| 8,177,048 B2* | 5/2012 | Sato et al. | ...................... | 198/619 |
| 8,616,820 B2* | 12/2013 | Kurita et al. | .................. | 414/217 |
| 8,623,765 B2* | 1/2014 | Ozawa et al. | ................. | 438/689 |

(Continued)

FOREIGN PATENT DOCUMENTS

| | | |
|---|---|---|
| JP | 2004-136275 A | 5/2004 |
| JP | 2005-197487 A | 7/2005 |
| KR | 2007-0071282 A | 7/2007 |
| KR | 20110009541 A | 1/2011 |

OTHER PUBLICATIONS

International Search Report and Written Opinion dated May 13, 2013 for PCT/US2013/022534.

*Primary Examiner* — James R Bidwell
(74) *Attorney, Agent, or Firm* — Patterson & Sheridan, LLP

(57) ABSTRACT

A dynamic load lock chamber that includes a plurality of actuators positioned along its length to achieve a desired pressure gradient from an atmospheric pressure side to a processing pressure side of the chamber is provided. The chamber includes a transport belt continuously running through the chamber to transport substrates from the atmospheric pressure side to the processing pressure side of the chamber, if situated on an inlet side of a production line, and from the processing pressure side to the atmospheric pressure side of the chamber, if positioned on an outlet side of the production line. Separation mechanisms may be attached to the belt to separate discrete regions within the chamber into a plurality of discrete volumes. Substrates may be disposed between the separation mechanisms, such that separation between adjacent pressure regions within the chamber is maintained as the substrates are transported through the chamber.

24 Claims, 5 Drawing Sheets

(56) References Cited

U.S. PATENT DOCUMENTS

| | | | |
|---|---|---|---|
| 2005/0163599 A1* | 7/2005 | Park | 414/217 |
| 2006/0278497 A1* | 12/2006 | White et al. | 198/339.1 |
| 2012/0213614 A1* | 8/2012 | Bonora et al. | 414/217 |
| 2013/0149075 A1* | 6/2013 | Shah et al. | 414/217 |

* cited by examiner

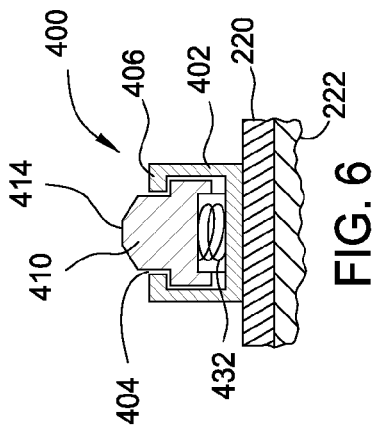
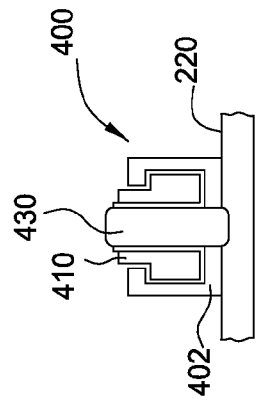
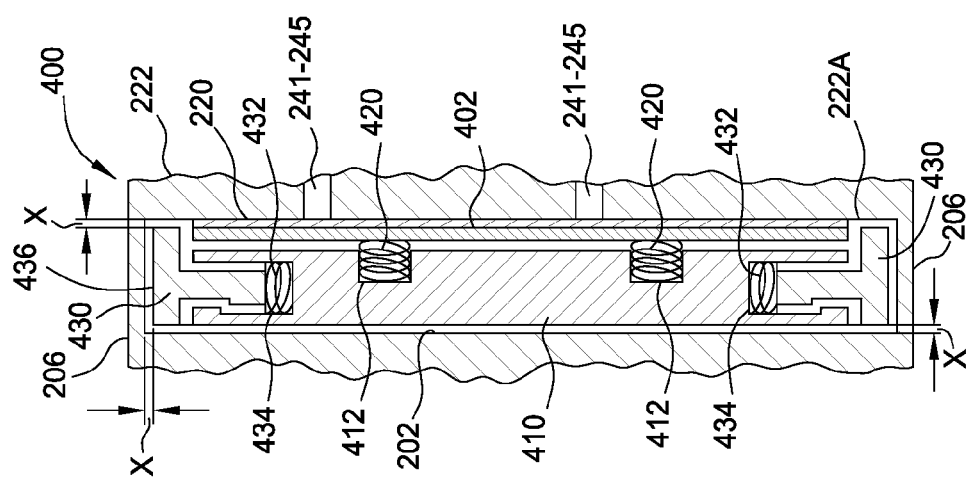
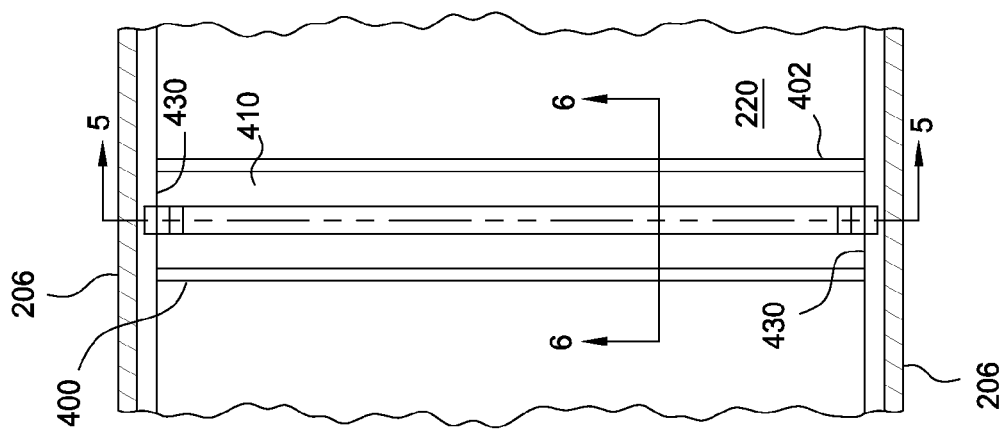

DYNAMIC LOAD LOCK WITH CELLULAR STRUCTURE FOR DISCRETE SUBSTRATES

CROSS-REFERENCE TO RELATED APPLICATIONS

This application claims benefit of U.S. Provisional Patent Application Ser. No. 61/612,080, filed Mar. 16, 2012 and U.S. Provisional Patent Application Ser. No. 61/596,654 filed Feb. 8, 2012, each of which is herein incorporated by reference.

BACKGROUND OF THE INVENTION

1. Field of the Invention

Embodiments of the present invention generally relate to a dynamic load lock chamber that is adapted to transfer one or more substrates from a first region that is at first pressure to a second region that is at a second pressure.

2. Description of the Related Art

Photovoltaic (PV) or solar cells are devices which convert sunlight into direct current (DC) electrical power. A typical PV cell includes a p-type silicon substrate with a thin layer of an n-type silicon material disposed on top of the p-type substrate. When exposed to sunlight (consisting of energy from photons), the p-n junction of the PV cell generates pairs of free electrons and holes. An electric field formed across a depletion region of the p-n junction separates the free electrons and holes, creating a voltage. A circuit from n-side to p-side allows the flow of electrons when the PV cell is connected to an electrical load. Electrical power is the product of the voltage times the current generated as the electrons and holes move through the external electrical load and eventually recombine. Each solar cell generates a specific amount of electrical power. A plurality of solar cells is tiled into modules sized to deliver the desired amount of system power.

The PV market has experienced growth with annual growth rates exceeding above 30% for the last ten years. Some articles have suggested that solar cell power production worldwide may exceed 10 GWp in the near future. It has been estimated that more than 90% of all photovoltaic modules are silicon wafer based. The high market growth rate in combination with the need to substantially reduce solar electricity costs has resulted in a number of serious challenges for silicon wafer production development for photovoltaics.

In order to meet these challenges, the following solar cell processing requirements generally need to be met: 1) the cost of ownership (CoO) for substrate fabrication equipment needs to be improved (e.g., high system throughput, high machine up-time, inexpensive machines, inexpensive consumable costs), 2) the area processed per process cycle needs to be increased (e.g., reduce processing per Wp) and 3) the quality of the formed layers and film stack formation processes needs to be well controlled and sufficient to produce highly efficient solar cells. Therefore, there is a need to cost effectively form and manufacture silicon sheets for solar cell applications.

Further, as the demand for solar cell devices continues to grow, there is a trend to reduce cost by increasing the substrate throughput and improving the quality of the deposition processes performed on the substrate. One challenge in this regard involves introduction of these fragile substrates from an atmospheric pressure environment into a low pressure processing environment. Traditionally, this involves moving a batch of substrates through a first slit valve opening, from an environment at atmospheric pressure into a load lock chamber, which is coupled to, but sealed from a low pressure processing environment using a second slit valve. The load lock chamber is then sealed from the atmospheric pressure environment using the first slit valve. The pressure is then slowly reduced within the chamber to at or near that in the processing chamber to prevent the movement of the low mass and fragile solar cell substrates. The solar cell substrates are then moved into the processing chamber through the second slit valve opening in the load lock chamber. The second slit valve is then closed and the load lock chamber is vented so that it can then receive the next batch of substrates.

However, this traditional load lock transfer process is time intensive and limits the processing capabilities of the entire production line, and thus, increasing the cost for producing the solar cell devices. To reduce this cost while also reducing surface contamination, there is a need for a design of a novel load lock chamber and process that enables high throughput, improved device yield, reduced number of substrate handling steps, and a compact system footprint.

SUMMARY OF THE INVENTION

In one embodiment, a load lock chamber comprises one or more walls enclosing a load lock region, a linear conveying mechanism disposed within the load lock region and extending from an atmospheric pressure side of the load lock region to a processing pressure side of the load lock region, a plurality of separation mechanisms attached to the linear conveying mechanism positioned to divide the load lock region into a plurality of discrete regions, and a plurality of actuators in fluid communication with the load lock region and configured to apply a pressure gradient across the plurality of discrete regions from the atmospheric pressure side to the processing pressure side.

In another embodiment, a method for transferring substrates from atmospheric pressure to a processing pressure comprises transferring one or more substrates from atmospheric pressure to a first pressure region within a load lock chamber, transferring the one or more substrates from the first pressure region to a second pressure region within the load lock chamber using a linear conveying mechanism, transferring the one or more substrates from the second pressure region into a third pressure region within the load lock chamber using the linear conveying mechanism, and transferring the one or more substrates into a processing pressure region using the linear conveying mechanism. The second pressure region has a pressure that is less than the first pressure region. The third pressure region has a pressure that is less than the second pressure region, and the processing pressure region has a pressure that is less than the third pressure region.

In yet another embodiment, a substrate processing system comprises a first load lock chamber comprising a first linear conveying mechanism configured to transfer substrates therethrough and having a plurality of first actuators fluidly coupled to a plurality of discrete regions within a load lock region of the first load lock chamber, one or more processing chambers coupled to the first load lock chamber, and a second load lock chamber coupled to the one or more processing chambers. The plurality of first actuators are configured to apply a pressure gradient from an atmospheric pressure side of the first load lock chamber to a processing pressure side of the first load lock chamber. The second load lock chamber comprises a second linear conveying mechanism configured to transfer substrates therethrough and having a plurality of actuators fluidly coupled to a plurality of discrete regions within a load lock region of the second load lock chamber. The plurality of second actuators are configured to apply a pressure gradient from a processing pressure side of the second load lock chamber to an atmospheric pressure side of the second load lock chamber.

In yet another embodiment, a method for transferring substrates from atmospheric pressure to a processing pressure, comprises disposing one or more substrates on a supporting surface of a linear conveying mechanism, wherein the one or more substrates and the supporting surface are disposed between two separation mechanisms that are coupled to a portion of the linear conveying mechanism, transferring the one or more substrates, the supporting surface and the two separation mechanisms through a load lock region that is defined by one or more walls of a load lock chamber, wherein the load lock region extends between a first region that is at atmospheric pressure and a second region that is at a processing pressure, and removing an amount of a gas from a volume defined between the supporting surface, the two separation mechanisms and at least a portion of the one or more walls as the one or more substrates are transferred through the load lock region. In one example, the processing pressure may be less than atmospheric pressure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 is a partial plan view of a separation mechanism attached to a transport belt according to one embodiment.

FIG. 5 is a cross-sectional view of the separation mechanism in FIG. 4 taken along lines 5-5.

FIG. 6 is a cross-sectional view of the separation mechanism in FIG. 4 taken along line 6-6.

FIG. 7 is a schematic end view of the separation mechanism in FIG. 4.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally includes a dynamic load lock chamber that may be disposed within a production line, for example, a solar cell production line, for processing a film stack used to form regions of a solar cell device. The dynamic load lock chamber includes a plurality of actuators positioned along its length to achieve a desired pressure gradient from an atmospheric pressure side of the dynamic load lock chamber to a processing pressure side of the dynamic load lock chamber. The dynamic load lock chamber further includes a flexible transport belt continuously running through the dynamic load lock chamber to transport substrates from the atmospheric pressure side of the dynamic load lock chamber to the processing pressure side of the dynamic load lock chamber, if situated on an inlet side of the production line, and from the processing pressure side of the dynamic load lock chamber to the atmospheric pressure side of the dynamic load lock chamber, if positioned on the outlet side of the production line. Separation mechanisms may be attached to the belt in order to separate discrete regions within the dynamic load lock chamber into a plurality of discrete volumes. Substrates, such as solar cell substrates, may be disposed singularly or in an array between the separation mechanisms, such that separation between adjacent pressure regions within the dynamic load lock chamber is maintained as the substrates are transported through the dynamic load lock chamber.

Figure 1:
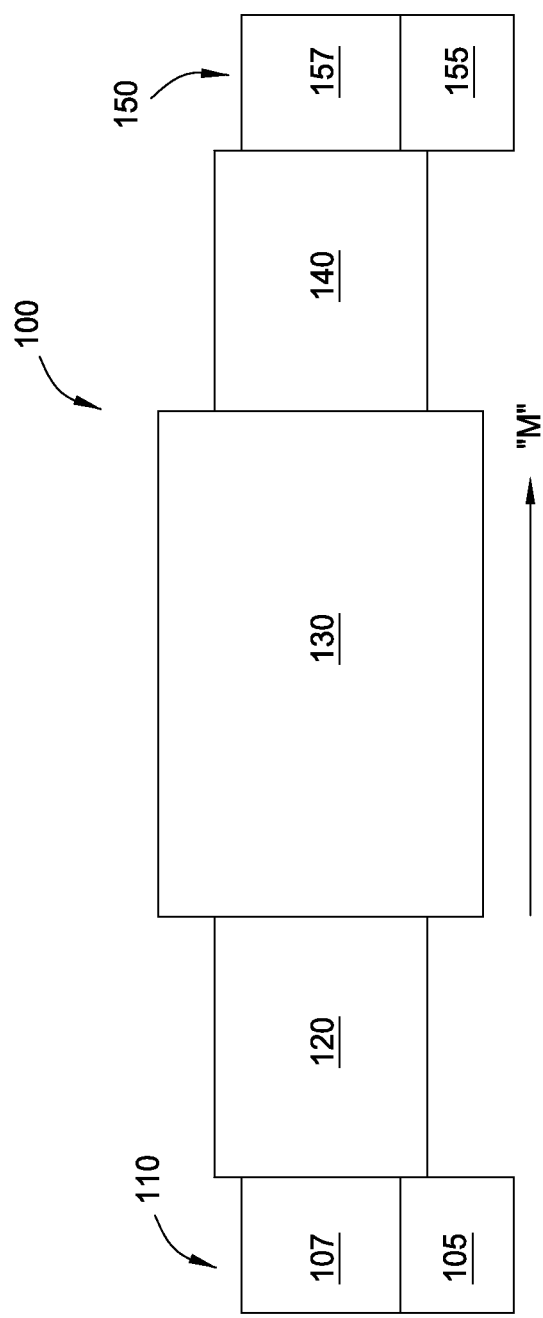
FIG. 1 is a schematic plan view of a substrate processing system in accordance with the present invention.

FIG. 1 is a schematic plan view of a substrate processing system 100 in accordance with the present invention. The processing system 100, for example, may be used for performing one or more solar cell fabrication processes on a linear array of substrates. The processing system 100 includes an input system 110, a first dynamic load lock chamber 120, one or more processing chambers 130, a second dynamic load lock chamber 140, and an output system 150. As illustrated, the substrate processing system 100 is configured for transferring a linear array of substrates during processing in a direction "M" from the input system 110 to the output system 150.

The input system 110 may include one or more automation devices, such as a conveyor system 107 that is configured to receive substrates from a substrate transport interface 105 and position them on a portion of the conveyor system 107 for transfer through the various chambers of the processing system 100. The substrate transport interface 105 may receive substrates from an upstream location (e.g., an upstream processing module in a solar cell fabrication line).

In operation, the conveyor system 107 may be loaded with unprocessed substrates via the substrate transport interface 105 in a clean environment at atmospheric pressure. The conveyor system 107 may then transfer the substrates into the first dynamic load lock chamber 120. As subsequently described, the first dynamic load lock chamber 120 provides staged pressure reduction as the substrates are passed from the input system 110, at atmospheric pressure, to an automation device 125 (FIG. 2) coupled to the one or more processing chambers 130, which is maintained in an environment that is at a moderate vacuum pressure (e.g., $10^{-2}$-$10^{-5}$ mbar).

After reaching the one or more processing chambers 130, the substrates are processed in a sequential fashion as they are transferred therethrough. In one embodiment, the one or more processing chambers include a series of sequential processing chambers. The processing chambers may include one or more of plasma enhanced chemical vapor deposition (PECVD) chambers, low pressure chemical vapor deposition (LPCVD) chambers, atomic layer deposition (ALD) chambers, physical vapor deposition (PVD) chambers, thermal processing chambers (e.g., rapid thermal processing (RTA) chambers), or other similar processing chambers. In addition, the one or more processing chambers 130 may also include one or more substrate buffer chambers, substrate transfer chambers, or substrate reorientation chambers.

After passing through the one or more processing chambers 130 by the use of one or more automation devices 125 (e.g., one or more conveyors), the linear array of substrates may be serially transferred into the second dynamic load lock chamber 140, which provides staged pressure increase as the substrates are passed from the one or more automation devices 125 in the one or more processing chambers 130, which is disposed in a region maintained at a moderate vacuum pressure (e.g., $10^{-2}$-$10^{-5}$ mbar), to the output system 150, which is maintained at atmospheric pressure.

The output system 150 may include one or more automation devices, such as a conveyor system 157 that is configured to deliver substrates to a substrate transport interface 155. The substrate transport interface 155 may deliver substrates to a downstream location (e.g., a downstream processing module in a solar cell fabrication line).

Figure 2:
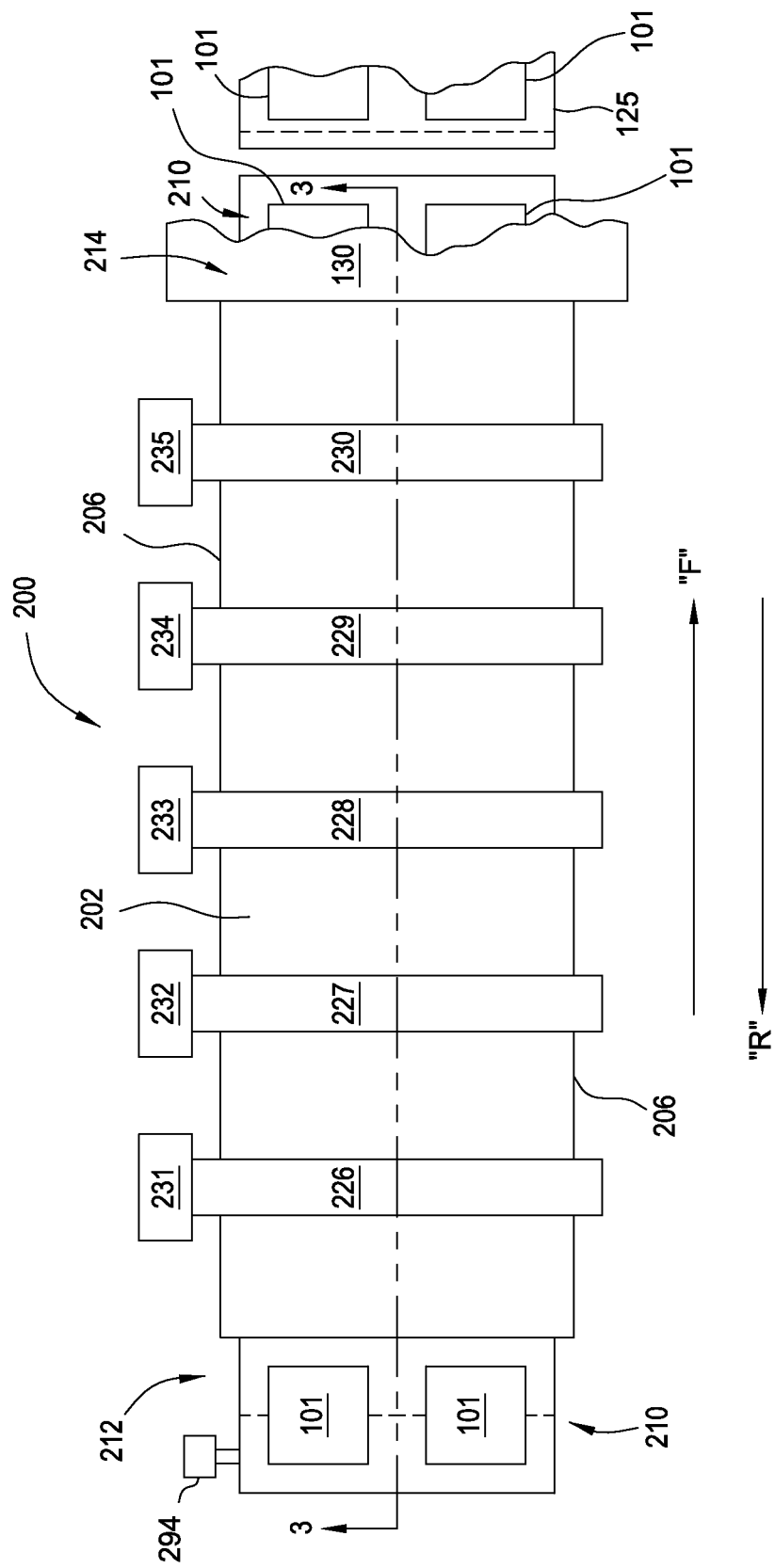
FIG. 2 is a schematic plan view of a dynamic load lock chamber according to one embodiment of the present invention.
Figure 3:
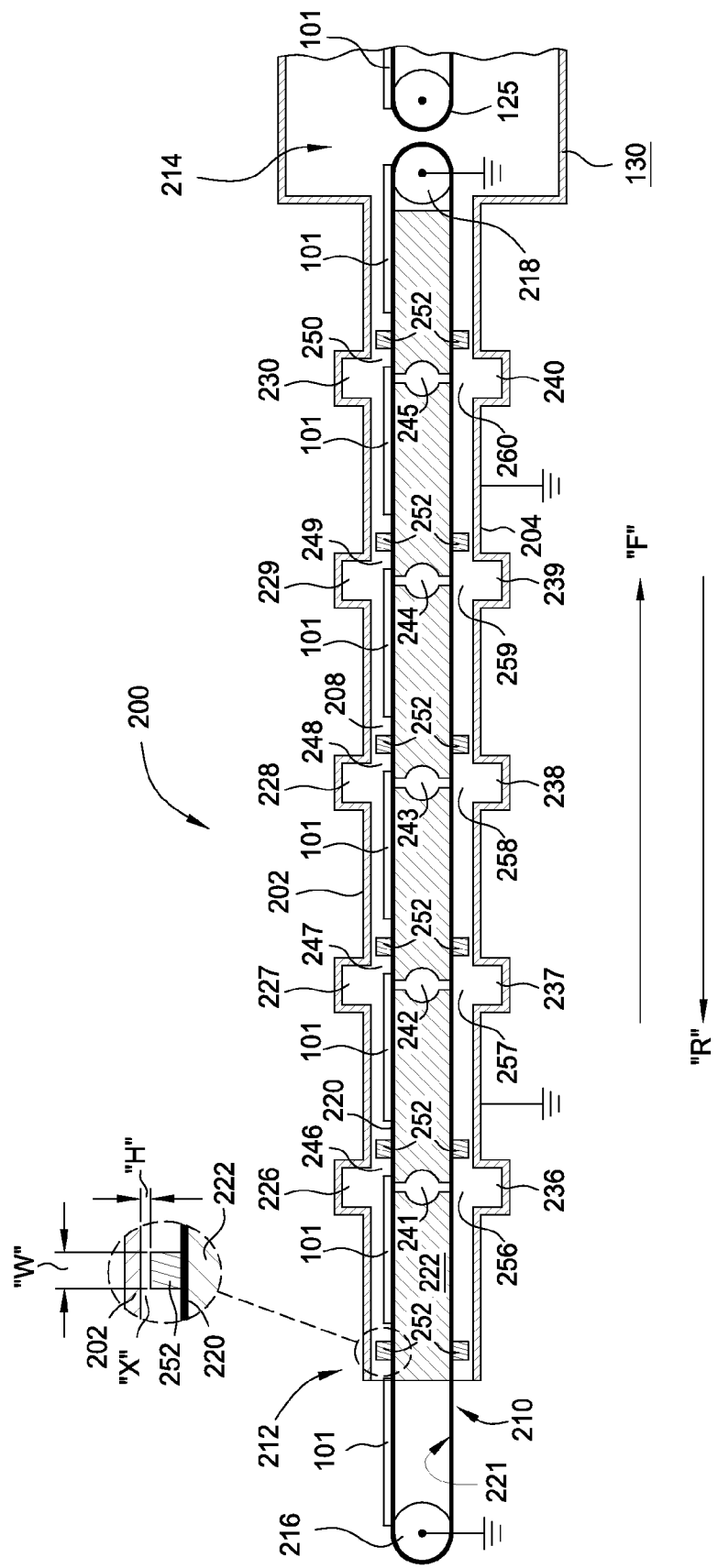
FIG. 3 is a schematic, cross-sectional view of the dynamic load lock chamber shown in FIG. 2 taken along section line 3-3.

FIG. 2 is a schematic plan view of a dynamic load lock chamber 200 according to one embodiment of the present invention. FIG. 3 is a schematic, cross-sectional view of the dynamic load lock chamber 200 shown in FIG. 2 taken along section line 3-3. The dynamic load lock chamber 200 may correspond to the first dynamic load lock chamber 120, when configured to transport the substrates 101 in the forward direction "F" (e.g., from atmospheric pressure to vacuum), and it may correspond to the second dynamic load lock chamber 140, when configured to transport the substrates 101 in a reverse direction "R" (e.g., from vacuum to atmospheric pressure), as shown in FIGS. 2 and 3.

Regardless of the direction in which the substrates 101 are transferred, a function of the dynamic load lock chamber 200 is to continuously transport the substrates 101 to or from the one or more processing chambers 130, while eliminating the flow of gases from an atmospheric pressure side of the dynamic load lock chamber 200 to the vacuum conditions inside the one or more processing chambers 130. To accomplish this desired function, the internal volume of the dynamic load lock chamber 200 is configured into a plurality of discrete volumes that are moveable along a linear path between the atmospheric side of the dynamic load lock chamber 200 and the vacuum conditions inside the one or more processing chambers 130 as the substrates, disposed within these discrete volumes, are transported therebetween. As subsequently described below, the pressure in the discrete volumes are separately reduced to staged levels as they are transferred along the substrate transfer path during the substrate transfer process. The division between the discrete volumes is provided by separation mechanisms disposed on a continuously moving, linear substrate transport belt, which transports substrates between the atmospheric side of the dynamic load lock chamber 200 and the one or more processing chambers 130.

The dynamic load lock chamber 200 includes a top wall 202, a bottom wall 204, and side walls 206 enclosing a staged load lock region 208. The walls 202, 204, and 206 may be fabricated from typical material used for substrate processing chambers, such as stainless steel or aluminum. A linear conveying mechanism 210 extends through the staged load lock region 208 from an atmospheric pressure side 212 of the dynamic load lock chamber 200 to a processing pressure side 214 of the dynamic load lock chamber 200. The linear conveying mechanism 210 includes one or more rollers 216 positioned on the atmospheric pressure side 212 and one or more rollers 218 positioned on the processing pressure side of the dynamic load lock chamber 200. The one or more rollers 216, 218 support and drive a continuous transport belt 220 of material configured to support and transport the substrates 101 through the load lock chamber 200. The rollers 216, 218 may be driven by a mechanical drive 294 (FIG. 2), such as a motor/chain drive (not shown), and may be configured to transport the transport belt at a linear speed of up to about 10 m/min. The mechanical drive 294 may be an electric motor (e.g., AC or DC servo motor) that is geared to provide a desired transport belt 220 velocity during processing. The transport belt 220 may be made of a stainless steel, aluminum, or polymeric material. One or more support plates 222 may extend between the side walls 206 to support an interior surface of the transport belt 220. The interior surface of the transport belt 220 is generally supported by a surface 222A (FIG. 5) of the one or more support plates 222.

The upper wall 202 of the load lock chamber 200 includes a plurality of pockets 226, 227, 228, 229, and 230 formed therein that are fluidly coupled to a plurality of actuators 231, 232, 233, 234, and 235, respectively. Each of the pockets 226-230 is further in fluid communication with a respective discrete region of the staged load lock region 208. For example, the pocket 226 is in fluid communication with a region 246. The pocket 227 is in fluid communication with a region 247. The pocket 228 is in fluid communication with a region 248. The pocket 229 is in fluid communication with a region 249, and the pocket 230 is in fluid communication with a region 250.

The lower wall 204 includes a plurality of corresponding pockets 236, 237, 238, 239, and 240 formed therein and coupled to the plurality of actuators 231, 232, 233, 234, and 235, respectively. Each of the pockets 236-240 is further in fluid combination with a respective discrete region of the staged load lock region 208. For example, the pocket 236 is in fluid communication with a region 256. The pocket 237 is in fluid communication with a region 257. The pocket 238 is in fluid communication with a region 258. The pocket 239 is in fluid communication with a region 259, and the pocket 240 is in fluid communication with a region 260.

In addition, the one or more support plates 222 may also include corresponding pockets 241, 242, 243, 244, and 245 formed therein that are coupled to the plurality of actuators 231, 232, 233, 234, and 235, respectively. Each of the pockets 241-245 are fluidly coupled to respective discrete regions of the staged load lock region 208. For example, the pocket 241 is in fluid communication with respective regions 246 and 256. The pocket 242 is in fluid communication with respective regions 247 and 257. The pocket 243 is in fluid communication with respective regions 248 and 258. The pocket 244 is in fluid communication with respective regions 249 and 259, and the pocket 245 is in fluid communication with respective regions 250 and 260.

In one embodiment, the plurality of actuators 231-235 includes a plurality of pumps set to progressively reduce the pressure in the dynamic load lock chamber 200 from the atmospheric pressure side 212 to the processing pressure side 214. In this embodiment, each of the pumps are configured to reduce a volume within the staged load lock region 208 corresponding to the pockets to which the pump is coupled. For example, the actuator 231 may be configured to reduce the pressure in respective regions 246 and 256 to a first pressure (e.g., 480-600 mbar), which is less than atmospheric pressure. The actuator 232 may be configured to reduce the pressure in respective regions 247 and 257 to a second pressure (e.g., 100-300 mbar), which less that the first pressure. The actuator 233 may be configured to reduce the pressure in respective regions 248 and 258 to a third pressure (e.g., 10-100 mbar), which is less than the second pressure. The actuator 234 may be configured to reduce the pressure in respective regions 249 and 259 to a fourth pressure ($10^{-2}$-1 mbar), which is less than the third pressure, and the actuator 235 may be configured to reduce the pressure in respective regions 250 and 260 to a fifth pressure ($10^{-4}$-$10^{-2}$ mbar), which is less than the fourth pressure and which may be greater than the pressure within the one or more processing chambers 130 (e.g., $10^{-5}$ mbar). In one configuration, the plurality of actuators 231-235 are replaced by a single actuator that is fluidly coupled to each of the pockets 226-230 and 236-245, wherein the single actuator is separately connected and valved to control the pressure within and/or gas flow received from each of these pockets. In another embodiment, the actuator 231 may include a compressor configured to inject clean dry air (CDA) or alternatively an inert gas, such as argon or nitrogen, into the respective regions 246 and 256 at a first pressure slightly above atmospheric pressure (e.g., 15-100 mbar above atmospheric pressure). Such an overpressure condition within the regions 246 and 256 assures that contaminants from the atmospheric pressure side 212 are not introduced into the dynamic load lock chamber 200 and consequently the one or more processing chambers 130.

In this embodiment, the actuators 232-235 include a plurality of pumps set to progressively reduce the pressure from the respective regions 246 and 256 to the processing pressure side 214 of the dynamic load lock chamber 200. For example, the actuator 232 may be configured to reduce the pressure in respective regions 247 and 257 to a second pressure (e.g., 300-600 mbar), which is less that the first pressure. The actuator 233 may be configured to reduce the pressure in respective regions 248 and 258 to a third pressure (e.g., 50-200 mbar), which is less than the second pressure. The actuator 234 may be configured to reduce the pressure in respective regions 249 and 259 to a fourth pressure (e.g., 1-50 mbar), which is less than the third pressure, and the actuator 235 may be configured to reduce the pressure in respective regions 250 and 260 to a fifth pressure (e.g., $10^{-2}$-1 mbar), which is less than the fourth pressure and which may be greater than the pressure within the one or more processing chambers 130 (e.g., $10^{-5}$ mbar).

Although the actuators 231-235 are configured for increased pressure reduction from the atmospheric pressure side 212 to the processing pressure side 214 of the dynamic load lock chamber 200, a difficulty remains in maintaining some separation between adjacent regions within the staged load lock region 208 because each of the adjacent regions are in fluid communication with one another. In order to assure such separation between adjacent regions and provide a semi-enclosed region in which to expose individual or groups of substrates 101 to each pressure stage as it passes through the dynamic load lock chamber 200, a plurality of separation mechanisms 252 are attached to the transport belt 220. The separation mechanisms 252 may be spaced along the surface of the transport belt such that one or more substrates 101 (e.g., an array of two or more substrates 101) may be positioned between each separation mechanism 252.

In addition, the separation mechanisms 252 may be positioned so that a small gap "X" is provided between surfaces of each separation mechanism 252, which are coupled to a portion of the transport belt 220, and the top wall 202, side wall 206 and/or bottom wall 204 of the dynamic load lock chamber 200. The gap "X" may have height "H" between 0 and 3 mm, preferably between 0 and 0.2 mm, and a width "W" between 1 and 30 mm. In one configuration, the gap "X" defined between each separation mechanism 252 and the top wall 202, side wall 206 and/or bottom wall 204 of the dynamic load lock chamber 200 provides a controlled fixed gap through which the gas disposed in an adjacent higher pressure region (e.g., region 246) will pass as it leaks into an adjacent lower pressure region (e.g., region 247) as both are moved in a desired direction as the transport belt 220 is moved by the mechanical drive 294. The separation mechanisms 252 are used to form a known and repeatable space through which gas will flow as the separation mechanisms 252 and substrates are moved, for example, from the atmospheric pressure side 212 to the processing pressure side 214 of the first dynamic load lock chamber 120. The pumping capacity of each of the actuators 231-235 and the size of gap "X" formed between the walls 202, 204, 206 and the separation mechanisms 252 are selected so that a controlled flow of gas, or "gas leak", is created between the separation mechanisms 252 and the walls 202, 204, 206, during the substrate transferring process, so that the pressure over the substrates 101 is continually reduced as they are transferred from one end of the dynamic load lock chamber 200 to the other in the forward "F" direction (i.e., first dynamic load lock chamber 120), or vice versa in the reverse direction "R" (i.e., second dynamic load lock chamber 140). In one embodiment, at least a portion of one or more of the separation mechanisms 252 are configured to contact one or more of the walls 202, 204, 206 to minimize the gap through which gas can flow from the higher pressure region on one side of the separation mechanism to the other side of the separation mechanism.

Further, since a back side 221 of the substrate transport belt 220 may provide a "gas leak" path between adjacent regions of the dynamic load lock chamber 200, the pockets 241-245 disposed within the one or more support plates 222 are configured to assure that the pressure conditions between the back side 221 of the transport belt 220 and the one or more support plates 222 is maintained at the same pressure as the remainder of the respective regions in which it is in fluid communication. For example, the pocket 241 is configured to assure that the back side 221 of the transport belt 220 within the region 246 is maintained at the same pressure as the region 246.

FIG. 4 is a partial plan view of a separation mechanism 400 attached to a transport belt 220 according to one embodiment. FIG. 5 is a cross-sectional view of the separation mechanism taken along lines 5-5. FIG. 6 is a cross-sectional view of the separation mechanism 400 taken along line 6-6. FIG. 7 is a schematic end view of the separation mechanism 400 from FIG. 4.

As illustrated, the separation mechanism 400 is a linear member disposed across the width of the transport belt 220. The separation mechanism 400 includes a housing member 402 attached to the transport belt 220 using one or more suitable fasteners, such as screws, bolts, adhesives, or the like. The housing member 402 may be fabricated from a material typically used in substrate processing environments, such as stainless steel, aluminum, or a suitable polymeric material. A vane 410 is disposed within the housing member 402. The vane 410 may be manufactured from a suitable polymer material, such as a self lubricating polymer to provide low sliding resistance and possibility of contamination when the vane 410 is in contact with the top wall 202 or bottom wall 204. One example of a polymer material that may be used in the vane 410 is ORIGINAL MATERIAL "S"® 8000 manufactured by Murtfeldt Kunststoffe GmbH & Co. KG of Dortmund, Germany. Alternatively, the vane 410 may be manufactured of other materials, such as a metallic material (e.g., stainless steel, aluminum) or graphite.

The vane 410 is spring-loaded within the housing member 402 using spring members 420. The spring members 420 may be mechanical springs. Alternatively, the spring members 420 may include magnetic, hydraulic, or pneumatic actuators. Optionally, the spring members 420 may include gravity activated actuation, such as a pivot or rocker which may be configured to an extended position under normal circumstances and pivot to a retracted position if contacted. The spring members 420 may be disposed within a slot 412 and contacting the housing member 402 such that an upper portion 414 of the vane 410 extends through an opening 404 in the housing member 402 and above an upper surface 406 of the housing member 402. As such, the vane 410 provides the gap "X" between the separation mechanism 400 and the top wall 202 and/or the bottom wall 204. Preferably the vane 410 is in contact with the top wall 202 and/or bottom wall 204 as the substrates are transported through the dynamic load lock chamber 200 to minimize the gas leak between discrete regions of the chamber 200. In addition, since the vane 410 is spring loaded, less friction between the separation mechanism 400 and top wall 202 or bottom wall 204 is provided during contact. Consequently, the chances of contamination within the dynamic load lock chamber 200 are significantly reduced.

The separation mechanism 400 further includes an end member 430 disposed at each end of the separation mechanism 400. Each end member 430 is spring-loaded within the vane 410 using spring members 432. The spring members 432 may be disposed within a slot 434 and contacting the vane 410 such that an outer portion 436 of the end member 430 extends outside of the outer surface of the vane 410. As such, each end member 430 provides a small gap (e.g., same dimensions as the gap "X") between the separation mechanism 400 and the respective side wall 206. Preferably, each end member 430 is in contact with the respective side wall 206 as the substrates are transported through the dynamic load lock chamber 200 to minimize the gas leak between discrete regions of the chamber 200. In addition, since the end members 430 are spring loaded, less friction between the separation mechanism 400 and the side walls 206 is provided during contact. Further, the spring members 432 may be manufactured from the same material as the vane 410, such as a self-lubricating polymer. Consequently, the chances of contamination within the dynamic load lock chamber 200 are significantly reduced. The end member 430 is generally configured so that a desirable gap (e.g., gap "X") is formed between its exterior surfaces and the surface 222A of the support plates 222 and the inner surfaces of side wall 206 and top wall 202. As described above, the gap "X" is sufficiently small to minimize "gas leak" between adjacent regions of the dynamic load lock chamber 200 as the substrates 101 are transported therethrough.

Figure 8:
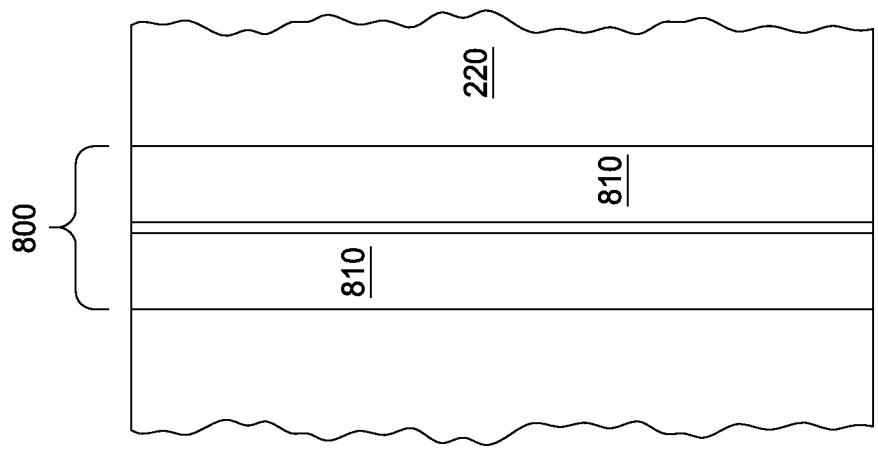
FIG. 8 is a partial plan view of dual separation mechanisms attached to a transport belt according to another embodiment.

FIG. 8 is a partial plan view of dual separation mechanisms 800 attached to the transport belt 220 according to another embodiment. In this embodiment, each of the separation mechanisms 800 may be similar to the separation mechanisms 400, or they may include block members 810 that do not include spring-loaded vanes or end members. In this dual member embodiment, the width of the gap "X" is extended in the transfer direction, allowing the height of the gap "X" to be greater, while still minimizing the "gas leak" path between adjacent regions of the load lock region 208 to maintain the staged pressure reduction from the atmospheric pressure side 212 to the processing pressure side 214 of the dynamic load lock chamber 200.

Figure 9:
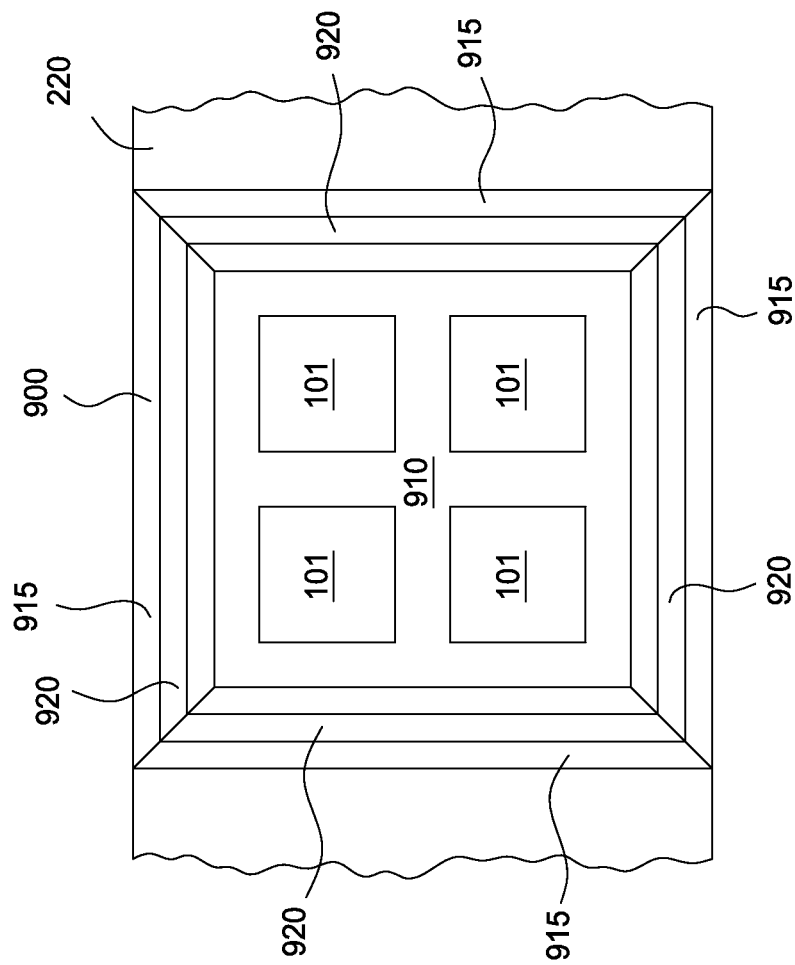
FIG. 9 is a partial plan view of a separation mechanism attached to a transport belt according to another embodiment.

FIG. 9 is a partial plan view of a separation mechanism 900 attached to the transport belt 220 according to another embodiment. In this embodiment, the separation mechanism 900 is configured in a rectangular layout in order to form a pocket 910 in which the substrates 101 are positioned. The separation mechanism 900 may include a spring-loaded vane 920 within each separation member 915, such as that shown and described with respect to separation mechanism 400. Accordingly, the separation mechanism 900 may be positioned to have the small gap "X", with dimensions similar to those described with respect to FIG. 4, between each of the separation members 915 and the top wall 202. Thus, adequate isolation between adjacent regions of the load lock region 208 to maintain the staged pressure reduction from the atmospheric pressure side 212 to the processing pressure side 214 of the dynamic load lock chamber 200 is provided by minimizing the "gas leak" path between adjacent substrate pockets 910.

Thus, a dynamic load lock chamber that may be disposed within a production line, for example, a solar cell production line, for processing a film stack used to form regions of a solar cell device is provided. The chamber includes a plurality of actuators positioned along its length to achieve a desired pressure gradient from an atmospheric pressure side of the chamber to a processing pressure side of the chamber. The chamber further includes a flexible transport belt continuously running through the chamber to transport substrates from the atmospheric pressure side of the chamber to the processing pressure side of the chamber, if situated on an inlet side of the production line, and from the processing pressure side of the chamber to the atmospheric pressure side of the chamber, if positioned on the outlet side of the production line. Separation mechanisms may be attached to the belt in order to separate discrete regions within the load lock chamber into a plurality of discrete volumes. Substrates, such as solar cell substrates, may be disposed singularly or in an array between the separation mechanisms and on the belt, such that separation between adjacent pressure regions within the chamber is maintained as the substrates are transported through the dynamic load lock chamber. Accordingly, a pressure gradient may be achieved for introducing substrates into a processing volume or removing substrates from a processing volume of the production line. As such increased tact times may be achieved within the line by maintaining continuous movement of substrates through the chamber. It is estimated, for example, that an increase from 2000 substrates per hour to 20000 substrates per hour may be accomplished with embodiments of the present invention as compared with the traditional "static" load lock approach.

While the foregoing is directed to embodiments of the present invention, other and further embodiments of the invention may be devised without departing from the basic scope thereof, and the scope thereof is determined by the claims that follow.

The invention claimed is:

1. A load lock chamber, comprising:
one or more walls defining a load lock region that extends between a first region that is at atmospheric pressure and a second region that is at a processing pressure;
a linear conveying mechanism disposed within the load lock region and extending from the first region to the second region;
a plurality of separation mechanisms coupled to the linear conveying mechanism and positioned to divide the load lock region into a plurality of discrete regions, wherein the linear conveying mechanism is configured to support and transfer one or more substrates disposed within the plurality of discrete regions; and
one or more actuators in fluid communication with the load lock region and configured to reduce the pressure in each of the plurality of discrete regions.

2. The load lock chamber of claim 1, wherein the linear conveying mechanism comprises a continuous belt member.

3. The load lock chamber of claim 1, further comprising a first actuator configured to provide a pressure within a first discrete region of the plurality of discrete regions that is greater than the pressure in the first region.

4. The load lock chamber of claim 3, wherein the plurality of actuators comprises a second actuator configured to provide a pressure within a second discrete region of the plurality of discrete regions that is less than the pressure in the first discrete region and greater than the pressure in the second region.

5. The load lock chamber of claim 4, wherein the plurality of actuators comprises a third actuator configured to provide a pressure within a third discrete region of the plurality of discrete regions that is less than the pressure in the second discrete region and greater than the pressure in the second region.

6. The load lock chamber of claim 1, wherein each separation mechanism comprises a spring-loaded vane.

7. The load lock chamber of claim 6, wherein each separation mechanism further comprises a spring-loaded end member.

8. The load lock chamber of claim 1, wherein each separation mechanism comprises two separation members extending across a width of the linear conveying mechanism.

9. The load lock chamber of claim 1, wherein each separation mechanism comprises a pocket for disposing one or more substrates therein.

10. A method for transferring substrates from atmospheric pressure to a processing pressure, comprising:
   transferring one or more substrates from atmospheric pressure to a first pressure region within a load lock chamber;
   transferring the one or more substrates from the first pressure region to a second pressure region within the load lock chamber using a linear conveying mechanism, wherein the second pressure region has a pressure that is less than the first pressure region;
   transferring the one or more substrates from the second pressure region into a third pressure region within the load lock chamber using the linear conveying mechanism, wherein the third pressure region has a pressure that is less than the second pressure region; and
   transferring the one or more substrates into a processing pressure region using the linear conveying mechanism, wherein the processing pressure region has a pressure that is less than the third pressure region.

11. The method of claim 10, wherein the first pressure region has a pressure that is greater than atmospheric pressure.

12. The method of claim 10, further comprising transferring the substrate from the third pressure region into a fourth pressure region of the load lock chamber using the linear conveying mechanism, wherein the fourth pressure region has a pressure that is less than the third pressure region and greater than the processing pressure region.

13. The method of claim 10, wherein the linear conveying mechanism comprises a continuous belt member.

14. A substrate processing system, comprising:
   a first load lock chamber comprising a first linear conveying mechanism configured to transfer substrates therethrough and having a plurality of first actuators fluidly coupled to a plurality of discrete regions within a load lock region of the first load lock chamber, wherein the plurality of first actuators are configured to apply a pressure gradient from an atmospheric pressure side of the first load lock chamber to a processing pressure side of the first load lock chamber;
   one or more processing chambers coupled to the first load lock chamber; and
   a second load lock chamber coupled to the one or more processing chambers, wherein the second load lock chamber comprises a second linear conveying mechanism configured to transfer substrates therethrough and having a plurality of actuators fluidly coupled to a plurality of discrete regions within a load lock region of the second load lock chamber, wherein the plurality of second actuators are configured to apply a pressure gradient from a processing pressure side of the second load lock chamber to an atmospheric pressure side of the second load lock chamber.

15. The substrate processing system of claim 14, wherein each of the first and second linear conveying mechanisms comprise a continuous belt member having a plurality of separation mechanisms attached thereto.

16. The substrate processing system of claim 15, wherein each separation mechanism comprises a spring-loaded vane.

17. The substrate processing system of claim 16, wherein each separation mechanism further comprises spring loaded end members.

18. The substrate processing system of claim 15, wherein each separation mechanism comprises dual separation member extending across a width of the linear conveying mechanism.

19. The substrate processing system of claim 15, wherein each separation mechanism comprises a pocket for disposing one or more substrates therein.

20. A method for transferring substrates from atmospheric pressure to a processing pressure, comprising:
   disposing one or more substrates on a supporting surface of a linear conveying mechanism, wherein the one or more substrates and the supporting surface are disposed between two separation mechanisms that are coupled to a portion of the linear conveying mechanism;
   transferring the one or more substrates, the supporting surface and the two separation mechanisms through a load lock region that is defined by one or more walls of a load lock chamber, wherein the load lock region extends between a first region that is at atmospheric pressure and a second region that is at a processing pressure; and
   removing an amount of a gas from a volume defined between the supporting surface, the two separation mechanisms and at least a portion of the one or more walls as the one or more substrates are transferred through the load lock region.

21. The method of claim 20, wherein the removing the amount of the gas from the volume, further comprises:
   receiving a portion of the gas disposed in the volume in a first pocket formed in the one or more walls of the load lock chamber when the linear conveying mechanism positions the volume so that it is in direct fluid communication with the first pocket.

22. The method of claim 21, further comprising:
   receiving a portion of the gas disposed in the volume in second pocket formed in the one or more walls of the load lock chamber when the linear conveying mechanism positions the volume so that it is in direct fluid communication with the second pocket.

23. The method of claim 20, wherein the second region is at a pressure that is less than the pressure in the first region.

24. The method of claim 20, wherein the linear conveying mechanism comprises a continuous belt member.

* * * * *